United States Patent [19]
Itoh et al.

[11] Patent Number: 5,493,311
[45] Date of Patent: Feb. 20, 1996

[54] TWO-FREQUENCY IMPEDANCE MATCHING CIRCUIT FOR AN ANTENNA

[75] Inventors: Ryoh Itoh; Yukio Yokoyama; Takao Ono, all of Tokyo, Japan

[73] Assignee: NEC Corporation, Tokyo, Japan

[21] Appl. No.: 202,495

[22] Filed: Feb. 28, 1994

[30] Foreign Application Priority Data

Feb. 26, 1993 [JP] Japan .................................. 5-037690

[51] Int. Cl.⁶ ..................................................... H01Q 1/50
[52] U.S. Cl. ............................................ 343/860; 343/900
[58] Field of Search .................................... 343/713, 858, 343/860, 900; H01Q 1/50

[56] References Cited

U.S. PATENT DOCUMENTS

| | | | |
|---|---|---|---|
| 1,604,981 | 11/1926 | Elsasser | 343/858 |
| 3,812,494 | 5/1974 | Howell et al. | 343/860 |
| 4,181,889 | 1/1980 | Davis et al. | |
| 4,583,097 | 4/1986 | Kropielnicki | 343/704 |
| 5,089,829 | 2/1992 | Haruyama et al. | 343/858 |

FOREIGN PATENT DOCUMENTS

| | | |
|---|---|---|
| 0531125 | 3/1993 | European Pat. Off. |
| 3410950 | 9/1985 | Germany |

OTHER PUBLICATIONS

Patent Abstracts of Japan, vol. 13, No. 259 (E–773) (3607) 15 Jun. 1989, of JP 1–54906 (Mar. 1989).
Patent Abstracts of Japan, vol. 13, No. 114 (E–730) (3462) 20 Mar. 1989, of JP 63–286008 (Nov. 1988).
By Y. Nemlikher et al., "Octave Transformers of Impedances Employing LC Elements", Telecommunications and Radio Engineering, Jan. 1992, vol. 47, No. 1, pp. 120–123.

*Primary Examiner*—Michael C. Wimer
*Attorney, Agent, or Firm*—Young & Thompson

[57] ABSTRACT

In order to achieve two-way communications at two different frequencies, an impedance matching circuit is coupled to an antenna. The circuit includes a first inductor which is directly coupled to the antenna. The first inductor induces antenna input impedance to be capacitive at a first resonant frequency and induces the antenna input impedance to be inductive at a second resonant frequency. The first resonant frequency is lower than the second resonant frequency. Further, a first capacitor is coupled to the first inductor. By providing the first capacitor, a reactance component at the first resonant frequency is rendered substantially equal to a reactance component at the second resonant frequency. Further, the circuit includes a second inductor and a second capacitor which are coupled between the second means and a feeder. The combination of the second inductor and the second capacitor is provided to adjust impedance, defined by the antenna and the first inductor and the first capacitor, to characteristic impedance of the feeder at the first and second resonant frequencies.

3 Claims, 6 Drawing Sheets

$$Z = Zin = R + \frac{1}{j\omega C} \quad \begin{pmatrix} R = 15\Omega \\ C = 2pF \end{pmatrix}$$

$$Z1 = Zin + j\omega L1 \quad (L1 = 17.5nH)$$

$$Z2 = \frac{1}{(1/Z1) + j\omega C1}$$

$(C1 = 20pF)$ $$Z3 = \cfrac{1}{\cfrac{1}{Z2 + j\omega L2} + j\omega C2}$$

$$\begin{pmatrix} L2 = 4nH \\ C2 = 12.0pF \end{pmatrix}$$

5,493,311

TWO-FREQUENCY IMPEDANCE MATCHING CIRCUIT FOR AN ANTENNA

BACKGROUND OF THE INVENTION

1. Field of the Invention

The present invention relates generally to an electronic circuit coupled to an antenna for impedance matching, and more specifically to such a circuit for impedance matching between an antenna and a feeder at two resonant frequencies via which two-way communications are established. The present invention is well suited for an antenna which is mounted on a portable radio telephone unit and thus required to be small in size.

2. Description of the Related Art

In recent years, a large number of handheld portable radio telephone units have been widely used and this tendency is ever increasing. A portable radio telephone unit communicates with a base station via two channels and thus requires an antenna to resonate at two different frequencies.

Before turning to the present invention it is preferable to briefly discuss, with reference to FIG. 1, a known antenna which resonates at two different frequencies. This prior art is disclosed in Japanese. Laid-open Patent Application No. 63-286008 on Nov. 22, 1988.

As shown in FIG. 1, an antenna depicted by numeral 10 is provided with two antenna elements 12 and 14 which resonate respectively at different frequencies $f_1$ and $f_2$ ($f_1<f_2$). The element 12 has a rod-like configuration while the other element 14 takes the form of a coil. One end of the coil 14 is electrically coupled to the top of the element 12. In order to electrically insulate the two antenna elements 12 and 14, an insulator tube 16 is provided between the two elements 12 and 14.

The element 12 is $\lambda_1/2$ long (where $\lambda_1$ is a wavelength of the resonant frequency $f_1$). The coil 14 extends on the top portion of the element 12 over a distance ($\lambda_1-\lambda_2$) and has a stretched length of $\lambda_2/4$ (where $\lambda_2$ is a wavelength of the resonant frequency $f_2$).

The antenna assembly 10 has one end coupled to an impedance matching circuit 17 which is in turn coupled, via a feeder 18, to a front end (not shown) of a handheld portable unit (not shown).

In order to achieve better portability, a handheld mobile unit antenna can be accommodated in the unit case when it is not used. However, It is difficult for the antenna of FIG. 1 to be contained in is not used in that the antenna 10 has a bulky top portion.

SUMMARY OF THE INVENTION

It is therefore an object of the present invention to provide a two-frequency impedance matching circuit via which an antenna coupled thereto no longer exhibits the complex configuration found in the prior art.

Another object of the present invention is to provide a two-frequency impedance matching circuit which is able to attain two-way communications at two different frequencies without applying any modification to conventional antenna as in the prior art.

One aspect of the present invention resides in techniques wherein in order to achieve two-way communications at two different frequencies, an improved impedance matching circuit is coupled to an antenna. The circuit includes a first inductor which is directly coupled to the antenna. The first inductor induces antenna input impedance to be capacitive resonant frequency and induces the antenna input impedance to be inductive at a second resonant frequency. The first resonant frequency is lower than the second resonant frequency. Further, a first capacitor is coupled to the first inductor. By providing the first capacitor, a reactance component at the first resonant frequency is rendered substantially equal to a reactants component at the second resonant frequency. Further, the circuit includes a second inductor and a second capacitor which are coupled between the second means and a feeder. The combination of the second inductor and the second capacitor is provided to adjust impedance, defined by the antenna and the first inductor and the first capacitor, to characteristic impedance of the feeder at the first and second resonant frequencies.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

One preferred embodiment of the present invention will be discussed with reference to FIGS. 2–7.

Figure 1:
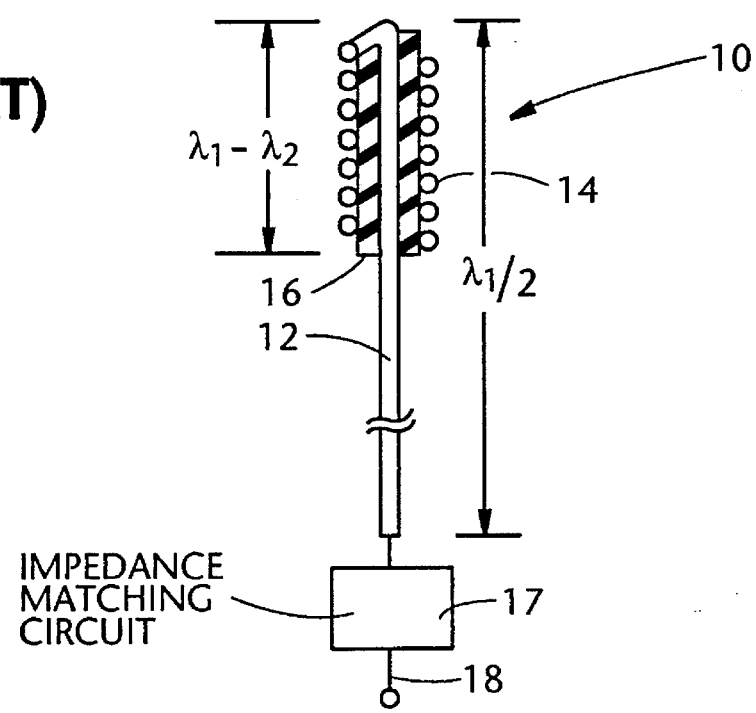
FIG. 1 is a diagram schematically showing a known antenna assembly which resonates at two different frequencies, having been referred to in the opening paragraphs of the instant disclosure.
Figure 2:
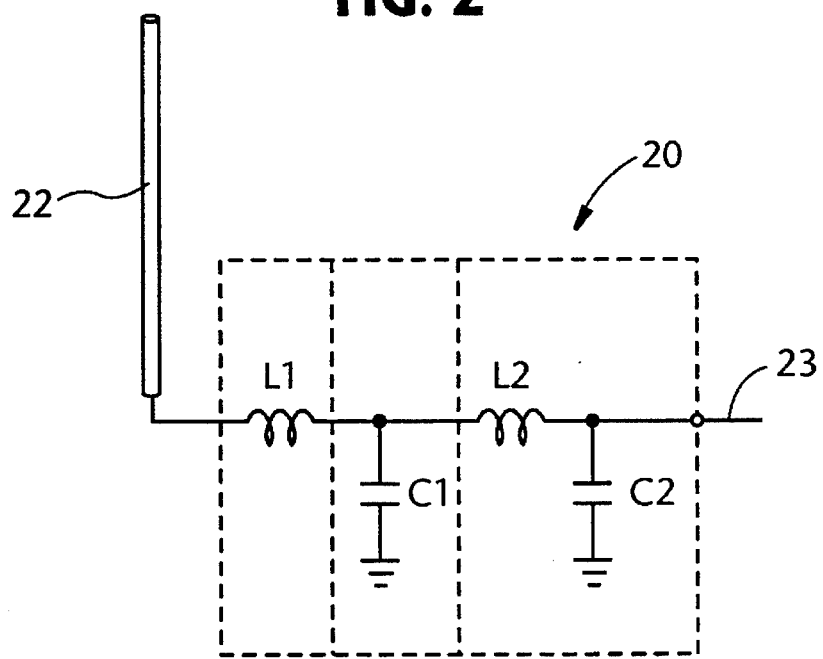
FIG. 2 is a diagram schematically showing a two-frequency matching circuit according to the present invention, the circuit being coupled to a whip type antenna.

As shown in FIG. 2, a two-frequency matching circuit 20 is provided between a so-called whip antenna 22 and an antenna feeder 23. The circuit 20 includes two inductors L1 and L2 and two capacitors C1 and C2, all of which are coupled as shown. It should be noted that each of L1 and L2 also indicates inductance while each of C1 and C2 also indicates capacitance in the instant disclosure.

The circuit 20 is arranged to implement impedance matching at two frequencies $f_1$ and $f_2$ ($f_1<f_2$). By designating Zin as an antenna input impedance, Zin can be represented by $$Zin=R+j(\omega L-1/\omega C)$$

where

R: resistance component of the antenna;

L: inductance component of the antenna 22; and

C: capacitance component of the antenna 22.

The inductor L1, coupled to the antenna 22, is such as to render input impedance (viz., Zin+jωL1) capacitive at the lower resonant frequency $f_1$ and inductive at the higher resonant frequency $f_2$.

In order to resonate the antenna 22 at the two frequencies $f_1$ and $f_2$, it is necessary to nullify or eliminate the reactance component of the input impedance (Zin+jωL1) at $f_1$ and $f_2$. To this end, the capacitor C1 is added such that the absolute values of the two reactance components of the input impedance at the resonance frequencies $f_1$ and $f_2$, are rendered equal with each other.

Finally, the combination of the inductor L2 and the capacitor C2 is provided for matching the input impedance Zin to a characteristic impedance of the feeder 23 (usually 50 Ω) at the two resonant frequencies $f_1$ and $f_2$.

For a better understanding of the embodiment shown in FIG. 2, a computer simulation was conducted by the inventors. The results of the computer simulation are given in FIGS. 3–7.

In the computer simulation, the following values were inputted into a program:

L1=17.5 nH

C1=20.0 pF

L2=4.0 nH

C2=12.0 pF

Further, it is assumed that the antenna was 0.48 λ long. The resistance and capacitive reactance of the antenna input impedance were set to 15 Ω and 2 pF, respectively. Still further, the two resonance frequencies $f_1$ and $f_2$ were set to 840 MHz and 940 MHz, respectively. Still further, impedances were calculated and plotted at a frequency interval of 10 MHz while varying the frequency applied from 810 MHz to 960 MHz.

Figure 3:
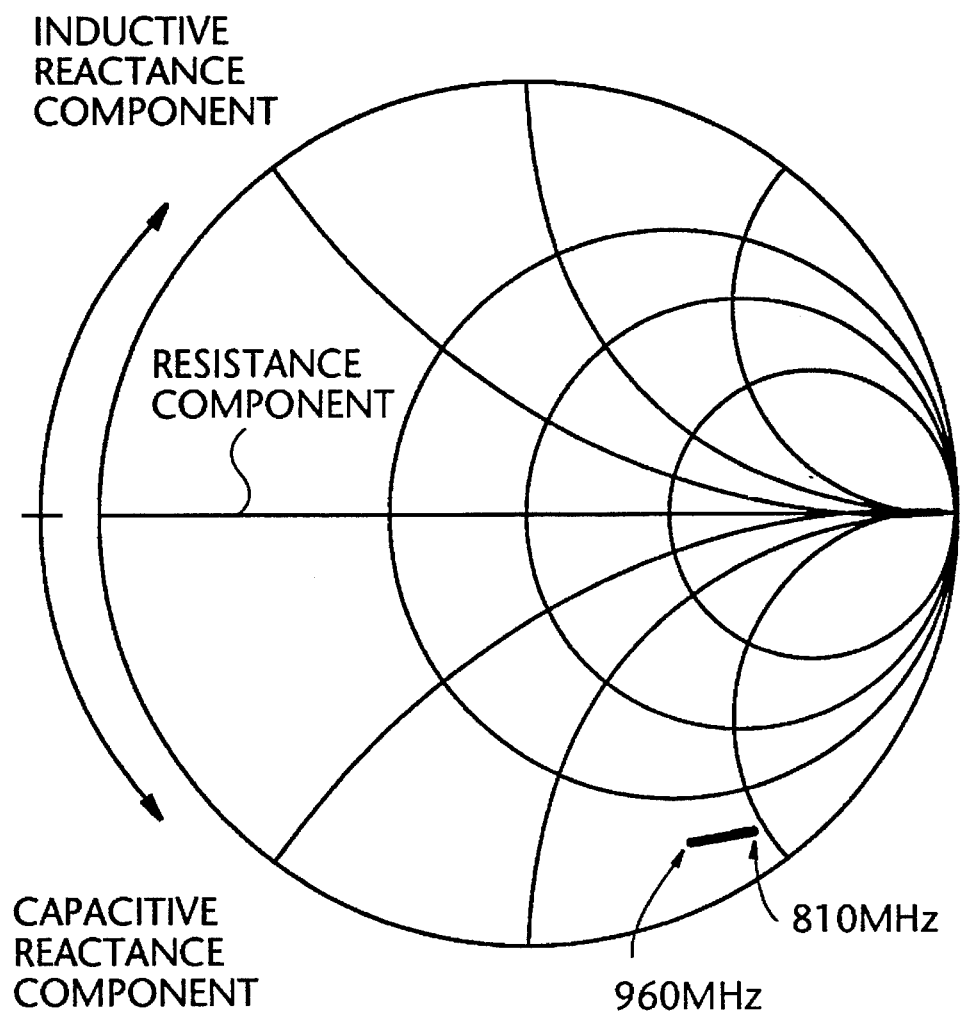
FIGS. 3–6 each is a diagram showing a plurality of impedances plotted on Smith chart at different frequencies for discussing the operations of the present invention, together with corresponding element or circuit and impedance equation.
Figure 3:

FIG. 3 is a diagram showing the results obtained at the first stage of the experiment. In FIG. 3, fifteen antenna input impedances Zin (=Z) are plotted on Smith chart at a frequency interval of 10 MHz between 810 MHz and 960 MHz. At the bottom of FIG. 3, an equation of antenna input impedance Zin is given for the sake of convenience.

Figure 4:
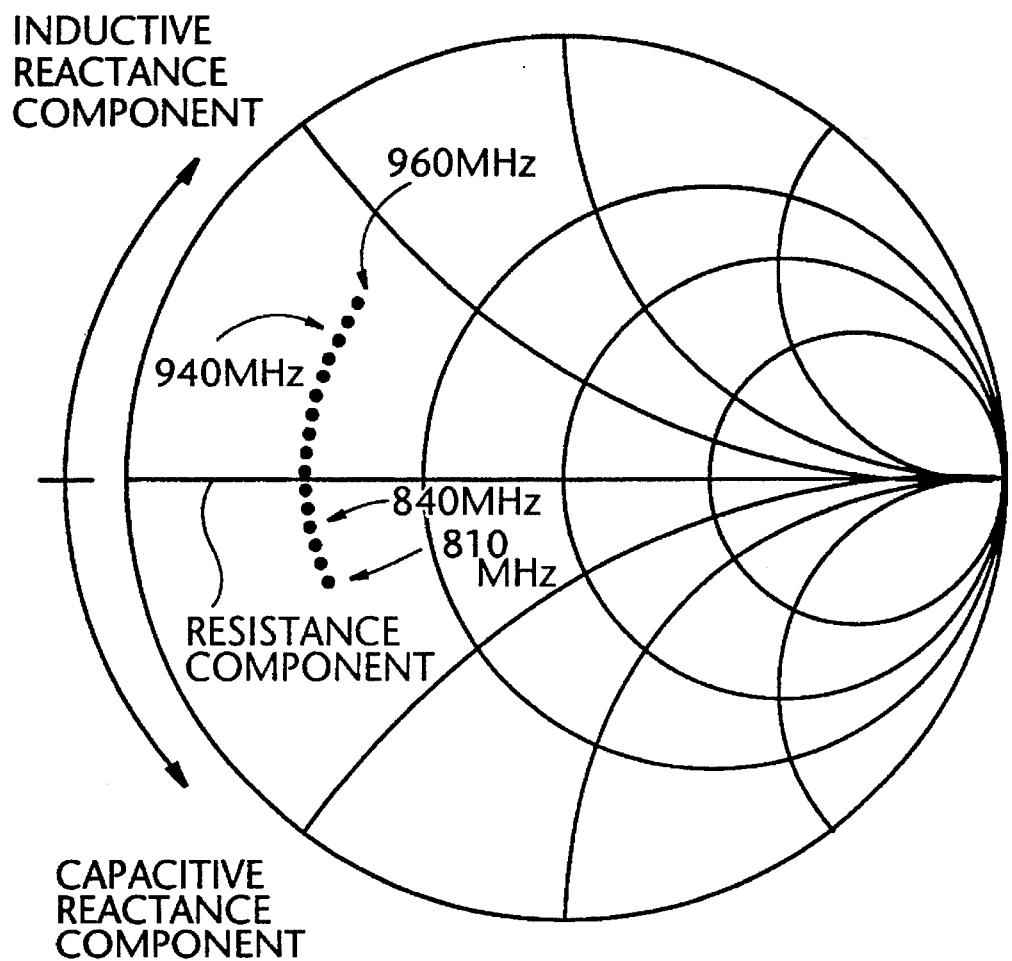
Figure 4:
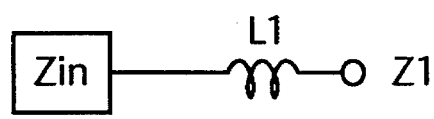

FIG. 4 is a diagram showing the results when the inductor L1 is added to the antenna 22. Fifteen impedances Z1 (=Zin+jωL1) are plotted on Smith chart at a frequency interval of 10 MHz while changing the frequency applied thereto from 840 MHz to 960 MHz. It is understood that the impedance Z1 becomes capacitive at $f_1$ (=840 MHz) and the impedance Z1 is rendered inductive at $f_2$ (=940 MHz).

Figure 5:
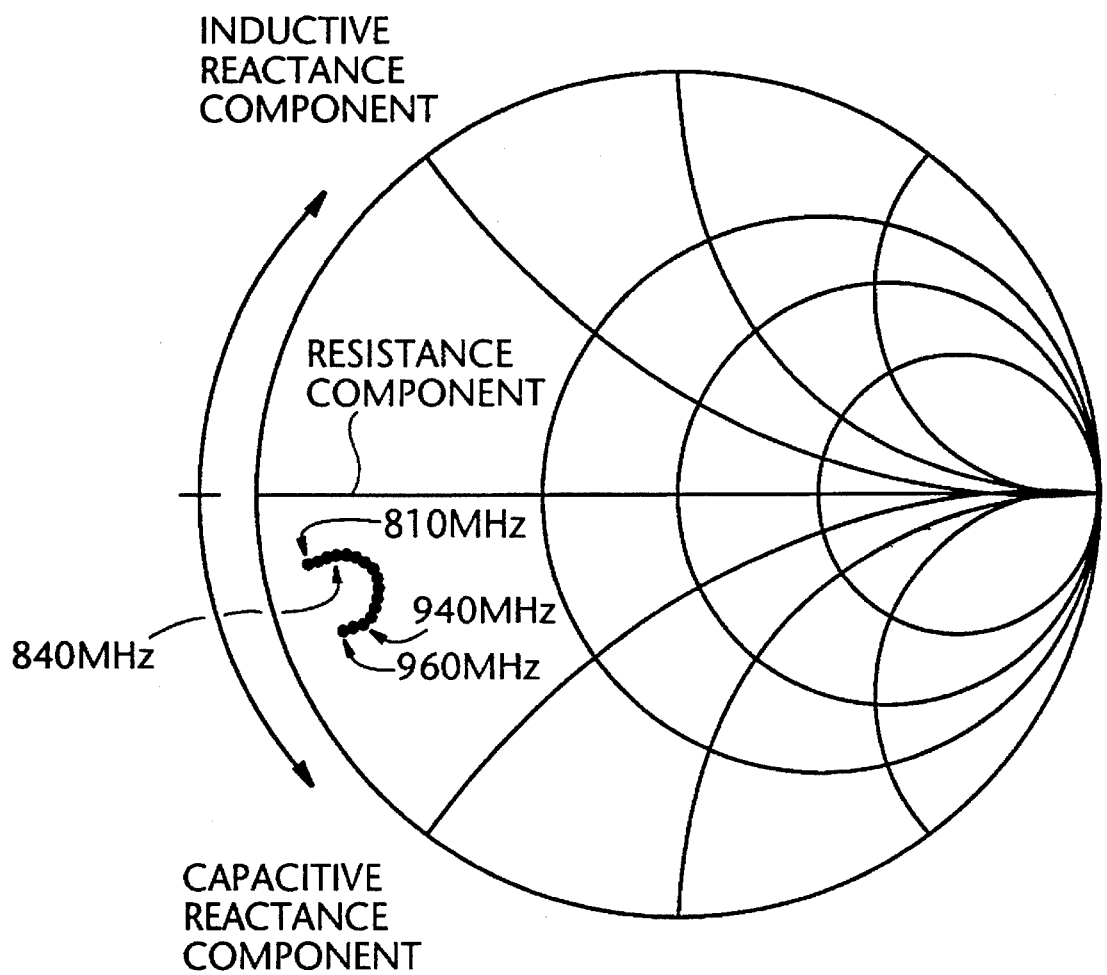
Figure 5:
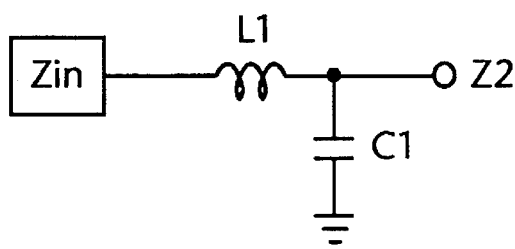

FIG. 5 is a diagram showing the results when the capacitor C1 is coupled in parallel to the inductor L1 of the circuit shown at the bottom of FIG. 4. In this instance, the total input impedance denoted by Z2 is given by $$Z2=1/\{(1/Z1)+j\omega C1\} \quad (1)$$

It is understood that the values of the reactance components of the input impedance at the resonance frequencies $f_1$ and $f_2$, are substantially equal with each other.

Figure 6:
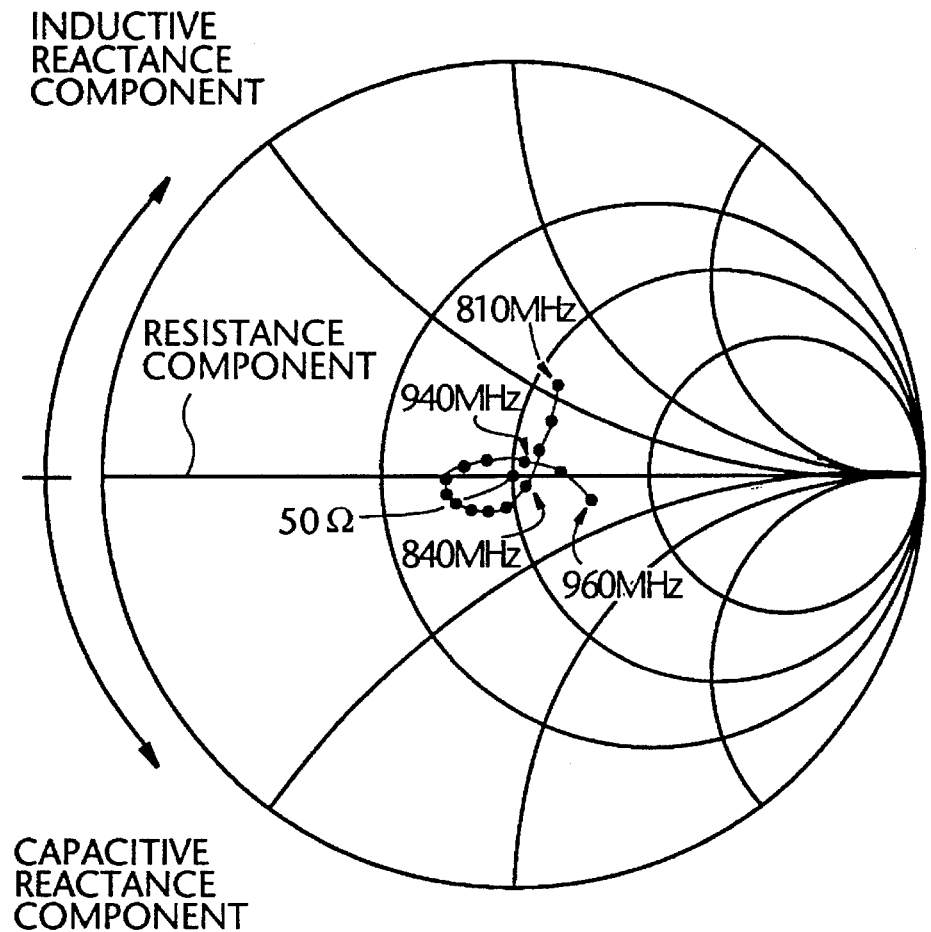
Figure 6:
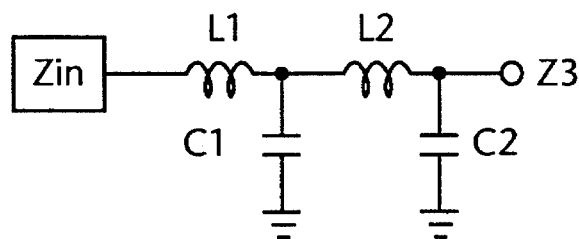

FIG. 6 is a diagram showing the results when the inductor L2 and the capacitor C2 are added to the circuit shown at the bottom of FIG. 5. The total impedance (depicted by Z3) is given by $$Z3=1/\{1/(Z2+j\omega L2)+j\omega C2\} \quad (2)$$

Fifteen impedances Z3 are plotted on Smith chart while varying the frequency applied thereto from 810 MHz to 960 MHz. The frequency interval between adjacent dots is 10 MHz as in the preceding cases. As shown, the impedances at $f_1$ (840 MHz) and $f_2$ (940 MHz) are located in the vicinity of the center point of the chart which indicates 50 Ω (viz., the feeder's characteristic impedance).

Figure 7:
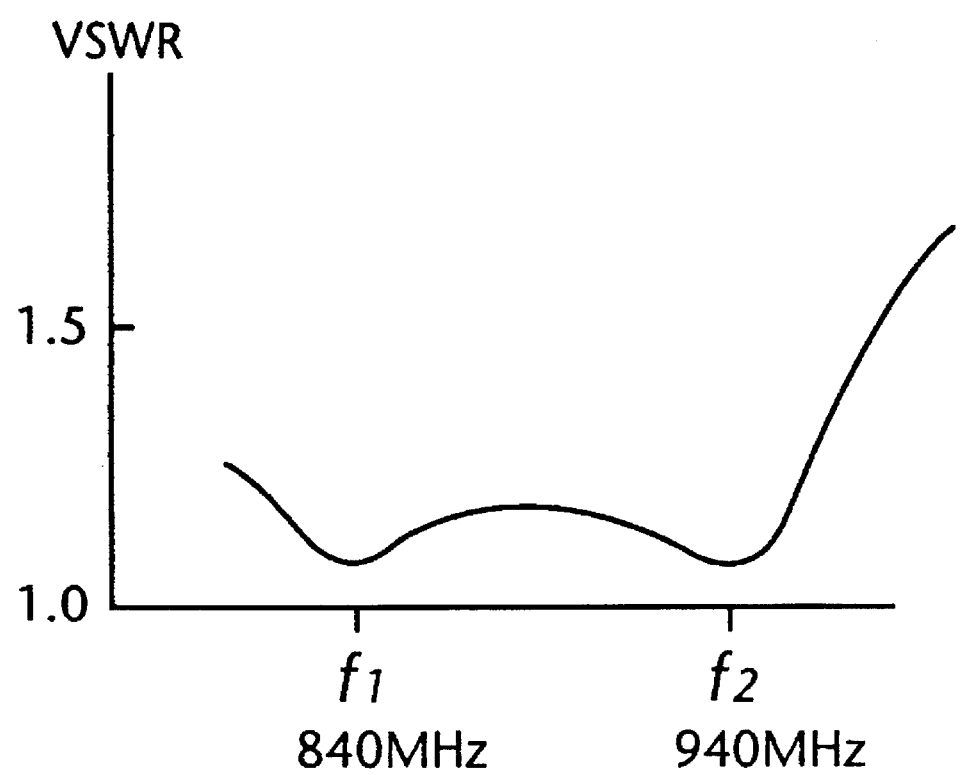
FIG. 7 is a graph schematically showing a relationship between VSWR (Voltage Standing Wave Ratio) and frequency, which was obtained by way of the experiment conducted by the inventors.

FIG. 7 is a graph showing a relationship between VSWR (Voltage Standing Wave Ratio) and frequency, which was obtained from the above mentioned experiment. As illustrated, a relatively wide bandwidth wherein VSWR is less than 1.5 can be obtained ranges from the frequency less than $f_1$ to that more than $f_2$.

In the above mentioned embodiment, the antenna 22 takes the form of a whip type antenna. However, the present invention is by no means limited to such an antenna.

For example, the instant invention is applicable to a so-called inverted-F antenna such as disclosed in a paper entitled "FD-TD analysis of a planar inverted-F antenna mounted on a conductive box", pages 713–716, in Proceedings of the 1992 International Symposium on Antennas and Propagation, Vol. 3: Sep. 24 (Thu).

It will be understood that the above disclosure is representative of only one possible embodiment of the present invention and that the concept on which the invention is based is not specifically limited thereto.

What is claimed is:

1. An electric circuit provided between an antenna and a feeder for impedance matching at a first resonant frequency and at a second resonant frequency, comprising:

first means, coupled to said antenna, for inducing an input impedance of said antenna to be capacitive at said first resonant frequency and for inducing said input impedance to be inductive at said second resonant frequency, said first resonant frequency being lower than said second resonant frequency;

second means, coupled to said first means, by which a reactance component at said first resonant frequency is rendered substantially equal to a reactance component at said second resonant frequency; and third means, coupled between said second means and said feeder, for matching an impedance of said antenna and said first and second means, to an impedance of said feeder simultaneously at both of said first and second resonant frequencies to thereby allow said antenna to resonate at said first and second resonant frequencies.

2. An electric circuit as claimed in claim 1, wherein said first means is an inductor whose inductance value is selected to cause said input impedance to be capacitive at said first frequency and inductive at said second frequency and said second means is a capacitor whose capacitance value is selected to substantially equalize reactance values at said first and second frequencies, and wherein said third means includes an inductor connected to a capacitor at a junction, said junction being coupled to said feeder.

3. An electric circuit provided between an antenna and a feeder for impedance matching at a first resonant frequency and a second resonant frequency, comprising:

a first inductor, coupled to said antenna, whose inductance value is selected to induce an input impedance of said antenna to be capacitive at said first resonant frequency and to induce said input impedance of said antenna to be inductive at said second resonant frequency, said first resonant frequency being lower than said second resonant frequency;

a first capacitor, coupled to said first inductor, whose capacitance value is selected to substantially equalize a reactance component at said first resonant frequency and a reactance component at said second resonant frequency; and a combination of a second inductor and second capacitor, coupled between said first capacitor and said feeder, whose values are selected to match an impedance of said antenna and said first inductor and said first capacitor, to an impedance of said feeder simultaneously at both of said first and second resonant frequencies to thereby allow said antenna to resonate at said first and second resonant frequencies.

* * * * *